United States Patent
Lahiri et al.

(10) Patent No.: US 9,294,106 B2
(45) Date of Patent: Mar. 22, 2016

(54) CAPACITANCE MULTIPLIER AND LOOP FILTER NOISE REDUCTION IN A PLL

(71) Applicant: STMicroelectronics International N.V., Schiphol (NL)

(72) Inventors: Abhirup Lahiri, Delhi (IN); Nitin Gupta, Kurukshetra (IN)

(73) Assignee: STMicroelectronics International N.V., Schiphol (NL)

( * ) Notice: Subject to any disclaimer, the term of this patent is extended or adjusted under 35 U.S.C. 154(b) by 0 days.

(21) Appl. No.: 14/323,794

(22) Filed: Jul. 3, 2014

(65) Prior Publication Data

US 2016/0006442 A1  Jan. 7, 2016

(51) Int. Cl.
  H03L 7/06    (2006.01)
  H03L 7/089   (2006.01)
  H03L 7/093   (2006.01)

(52) U.S. Cl.
  CPC .............. H03L 7/0893 (2013.01); H03L 7/093 (2013.01)

(58) Field of Classification Search
  USPC .................................. 327/147–149, 156–158
  See application file for complete search history.

(56) References Cited

U.S. PATENT DOCUMENTS

| | | | | |
|---|---|---|---|---|
| 6,166,577 A * | 12/2000 | Mizuno | .......... | H03K 19/018585 327/155 |
| 7,091,759 B2 * | 8/2006 | Sowlati | ................ | H03L 7/0893 327/156 |
| 7,701,271 B1 * | 4/2010 | Sanielevici | ........... | H03L 7/1976 327/157 |
| 8,723,567 B1 * | 5/2014 | Dang | ................ | H03H 11/1269 327/156 |
| 2005/0093688 A1 * | 5/2005 | Sinnett | ................ | B60C 23/0433 340/447 |
| 2009/0189659 A1 | 7/2009 | Goldman | | |
| 2010/0099372 A1 * | 4/2010 | Wang | ................ | H03H 11/1291 455/313 |
| 2011/0215848 A1 * | 9/2011 | Koroglu | ................ | H03L 7/06 327/157 |
| 2011/0234275 A1 * | 9/2011 | Sato | ........................ | H03L 7/089 327/157 |
| 2012/0119801 A1 * | 5/2012 | Hsieh | ..................... | H03L 7/087 327/156 |
| 2012/0200327 A1 | 8/2012 | Sreekiran et al. | | |
| 2012/0235718 A1 * | 9/2012 | Thakur | ................. | H03L 7/0891 327/157 |
| 2012/0249193 A1 * | 10/2012 | Willey | ................... | G11C 7/222 327/142 |
| 2012/0268178 A1 * | 10/2012 | Reddy | ................. | H03F 3/45179 327/157 |
| 2013/0027101 A1 * | 1/2013 | Cherkassky | ........... | H03L 7/0995 327/157 |
| 2013/0154697 A1 * | 6/2013 | Katsushima | .............. | H03L 7/06 327/157 |
| 2014/0015577 A1 * | 1/2014 | Kumar | ..................... | H03L 7/093 327/157 |
| 2014/0266343 A1 * | 9/2014 | Song | ...................... | H03L 7/0802 327/157 |

(Continued)

OTHER PUBLICATIONS

Koo, Y et al., "A Fully Integrated CMOS Frequency Synthesizer with Fully Charge-Averaging Charge Pump and Dual-Path Loop Filter for PCS- and Cellular-CDMA Wireless Systems," IEEE Journal of Solid-State Circuits, vol. 37, No. 5, May 2002, 7 pages.

(Continued)

Primary Examiner — Adam Houston
(74) Attorney, Agent, or Firm — Slater & Matsil, LLP

(57) ABSTRACT

According to an embodiment, a circuit includes a first charge pump configured to generate a first current at a first node, a second charge pump configured to generate a second current at a second node, a loop filter coupled between the first and second nodes, the loop filter including a first filter path coupled to the first node, a second filter path coupled to the second node, and an isolation buffer interposed between the first and second filter paths. The second current at the second node is different than the first current at the first node. The circuit further includes an oscillator configured to apply a first gain to an output of the first filter path and a second gain to an output of the second filter path.

30 Claims, 5 Drawing Sheets

(56) References Cited

U.S. PATENT DOCUMENTS

2015/0002195 A1* 1/2015 Englekirk ............. H03L 7/0891
  327/157
2015/0004919 A1* 1/2015 Ek ........................... H03L 7/087
  455/75

OTHER PUBLICATIONS

Lee, T.C. et al., "A Stabilization Technique for Phase-Locked Frequency Synthesizers," 2001 Symposium on VLSI Circuits Digest of Technical Papers, 2001, 4 pages.

* cited by examiner

CAPACITANCE MULTIPLIER AND LOOP FILTER NOISE REDUCTION IN A PLL

TECHNICAL FIELD

The present invention relates generally to phase locked loops (PLLs), and, in particular to a design for a charge pump, a loop filter, and a voltage controlled oscillator (VCO) for a PLL.

BACKGROUND

Electronic devices of all kinds employ use of phase-locked loops (sometimes called phase lock loops) for manipulating electronic signals. A phase-locked loop (PLL) is a control system that generates an output signal having a phase and frequency that is related to the phase and frequency of an input signal (often called a reference signal). The circuit compares the phase of the input signal with the phase of the signal at the output and adjusts the frequency of an oscillator to keep the phase of the generated output signal matched to the phase of the input signal. By keeping the phases of these signals locked to each other, one can be assured that the frequency of the output signal also matches the frequency (or an integer multiple thereof) of the input signal.

Keeping the input and output signals locked in to the same frequency allows for higher and higher speed signal processing and communication to occur. PLL circuits are widely employed in radio, telecommunications, computers, and other electronic applications. In various applications, a PLL circuit may be used to recover a signal from a noisy communication channel, generate stable frequencies at a multiple of an input frequency (frequency synthesis), or distribute clock timing pulses in digital logic designs such as microprocessors. Since a single integrated circuit can provide a complete PLL circuit, the technique is widely used in modern electronic devices, with output frequencies from a fraction of a hertz up to many gigahertz.

As PLL circuits are called upon to be employed in devices having faster speed requirements and having lower power supply voltages, electronic noise, such as thermal noise, and device size become larger factors in the design of the PLL.

SUMMARY OF THE INVENTION

According to an embodiment, a circuit includes a first charge pump configured to generate a first current at a first node, a second charge pump configured to generate a second current at a second node, a loop filter coupled between the first and second nodes, the loop filter including a first filter path coupled to the first node, a second filter path coupled to the second node, and an isolation buffer interposed between the first and second filter paths. The second current at the second node is different than the first current at the first node. The circuit further includes an oscillator configured to apply a first gain to an output of the first filter path and a second gain to an output of the second filter path.

According to another embodiment, a phase-locked loop (PLL) includes a phase detector, a first charge pump and a second charge pump coupled to the phase detector, the first charge pump configured to generate a first current and the second charge pump configured to generate a second current, the second current being larger than the first current. The PLL further includes a loop filter coupled to the first charge pump and the second charge pump, a first filter path coupled to the first charge pump and a second filter path coupled to the second charge pump, the first and second filter paths being separated by an isolation buffer, and an oscillator coupled to outputs of the first and second filter paths, the oscillator configured to reduce the thermal noise of the second filter path and the isolation buffer.

According to a further embodiment, a method of operating a phase locked loop includes generating an oscillating signal, comparing the oscillating signal with an input signal, generating a first control signal having a first current at a first node based on the comparison of the oscillating signal with the input signal, generating a second control signal having a second current at a second node based on the comparison of the oscillating signal with the input signal, the second current being different than the first current. The method further includes filtering the first control signal using a first filter path, filtering the second control signal using a second filter path, the second filter path being substantially isolated from the first filter path, and modifying the oscillating signal based on the filtered first control signal and the filtered second control signal.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to embodiments in a specific context, namely a phase-locked loop (PLL) and a method of operating a PLL. Some of the various embodiments described herein include a PLL for use in a radio frequency (RF) transceiver, telecommunications, computers, or any system which can utilize a PLL. In other embodiments, aspects may also be applied to other applications involving any type of PLL according to any fashion known in the art.

In general terms, using embodiments of the present disclosure, devices can leverage a PLL that has a reduced area and reduced noise. In particular, the present disclosure utilizes a dual charge pump to decouple the integral path and the proportional path of the PLL. This allows for the integral path to realize capacitance multiplication by reducing the current for one charge pump of the dual charge pump, and thus, saving the large area typically required for the zero-capacitance capacitor. In addition, the noise from the resistor and other devices in the proportional path can be reduced by having the majority of the gain in the voltage-controlled oscillator (VCO) in the integral path and reducing the gain in the proportional path. This reduction of the gain in the proportional path prevents the VCO from amplifying the noise of the resistor and the other devices in the proportional path.

Figure 1:
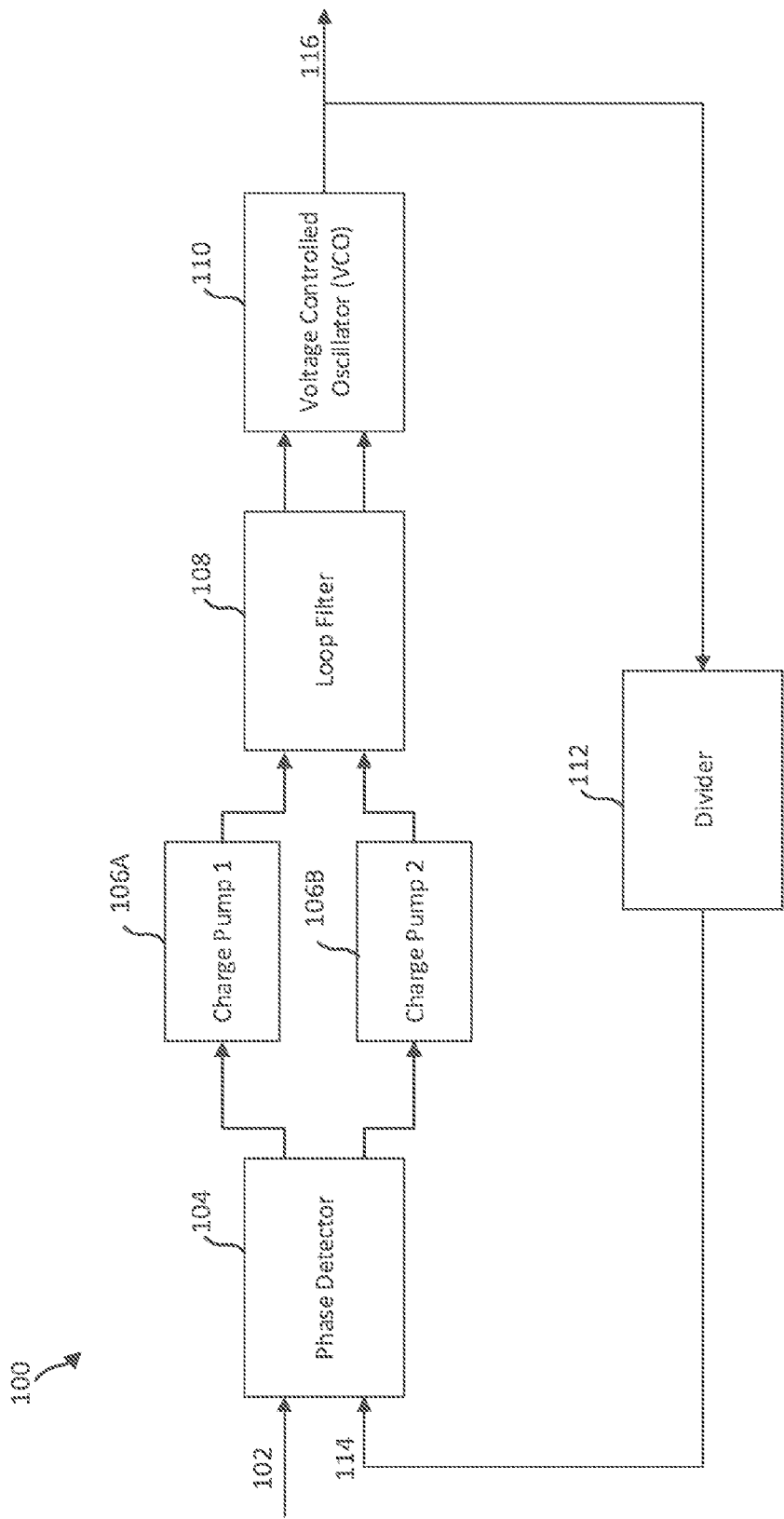
FIG. 1 is a block diagram of a phase-locked loop in accordance with an embodiment.

FIG. 1 is a block diagram of a PLL 100 in accordance with an embodiment. The PLL 100 includes an input signal 102, a phase detector 104, charge pumps 106A and 106B, a loop filter 108, a VCO 110, an output signal 116, a frequency divider 112, and a feedback signal 114. The PLL 100 may be an analog PLL or a digital PLL. The components and blocks of FIG. 1 are shown merely by way of illustration. Other PLL implementations may contain more or fewer components/blocks. In particular, the embodiments of the present disclosure can be implemented in other applications of feedback loops.

The PLL 100 receives an input signal 102 (sometimes referred to as a reference signal) having a frequency F1, and generates an output signal 116 having a frequency F2, and having a substantially same phase as the input signal 102. The ratio F2/F1 may be determined by a divide factor applied by the frequency divider 112.

The phase detector 104 compares the input signal 102 and the feedback signal 114 and produces one of two control signals, often simply called an up signal and a down signal. The phase detector 104 outputs a phase-indicator up signal and a phase-indicator down signal, which are used to control the charge pumps 106A and 106B, with each of the charge pumps 106A and 106B receiving both the phase-indicator up signal and a phase-indicator down signal.

The charge pumps 106A and 106B receive the phase-indicator up signal and a phase-indicator down signals from the phase detector 104 and generate corresponding current pulses as outputs to the loop filter 108. The loop filter 108 filters the current pulses from the charge pumps 106A and 106B, and generate filtered signals to output to the VCO 110.

The VCO 110 then generates a periodic output signal 116 based on these filtered input signals. For example, if initially, the VCO 110 is set to nearly the same frequency as the input signal 102, then small adjustments through the feedback signal 114 may keep the phases of the output signal 116 and the input signal 102 locked to within a desired threshold. If the phase from the VCO 110 is determined to be behind that of the input signal 102, the phase detector 104 adjusts the control signals to the VCO 110 so that it speeds up. Likewise, if the phase from the VCO 110 is determined to be ahead of the input signal 102, the phase detector 104 adjusts the control signals to slow down the VCO 110.

This output signal 116 is also sent through a frequency divider 112 in order to make the PLL's output signal 116 frequency a multiple of the input signal 102 frequency. In some embodiments, the frequency divider 112 is a divide-by-integer divider that makes the feedback signal 14 an integer multiple of the frequency of the input signal 102. In other embodiments, a non-integer multiple of the input signal frequency can also be created by replacing the simple divide-by-N counter in the frequency divider 112 with a programmable pulse swallowing counter. This technique is usually referred to as a fractional-N synthesizer or fractional-N PLL.

Although the feedback path of the PLL 100 is shown with only a frequency divider 112, one of ordinary skill in the art would understand that the feedback path is not limited to a frequency divider. Other details of the charge pumps 106A and 106B, the loop filter 108, and the VCO 110 will be discussed below in reference to FIGS. 2, 3, and 4.

Figure 2:
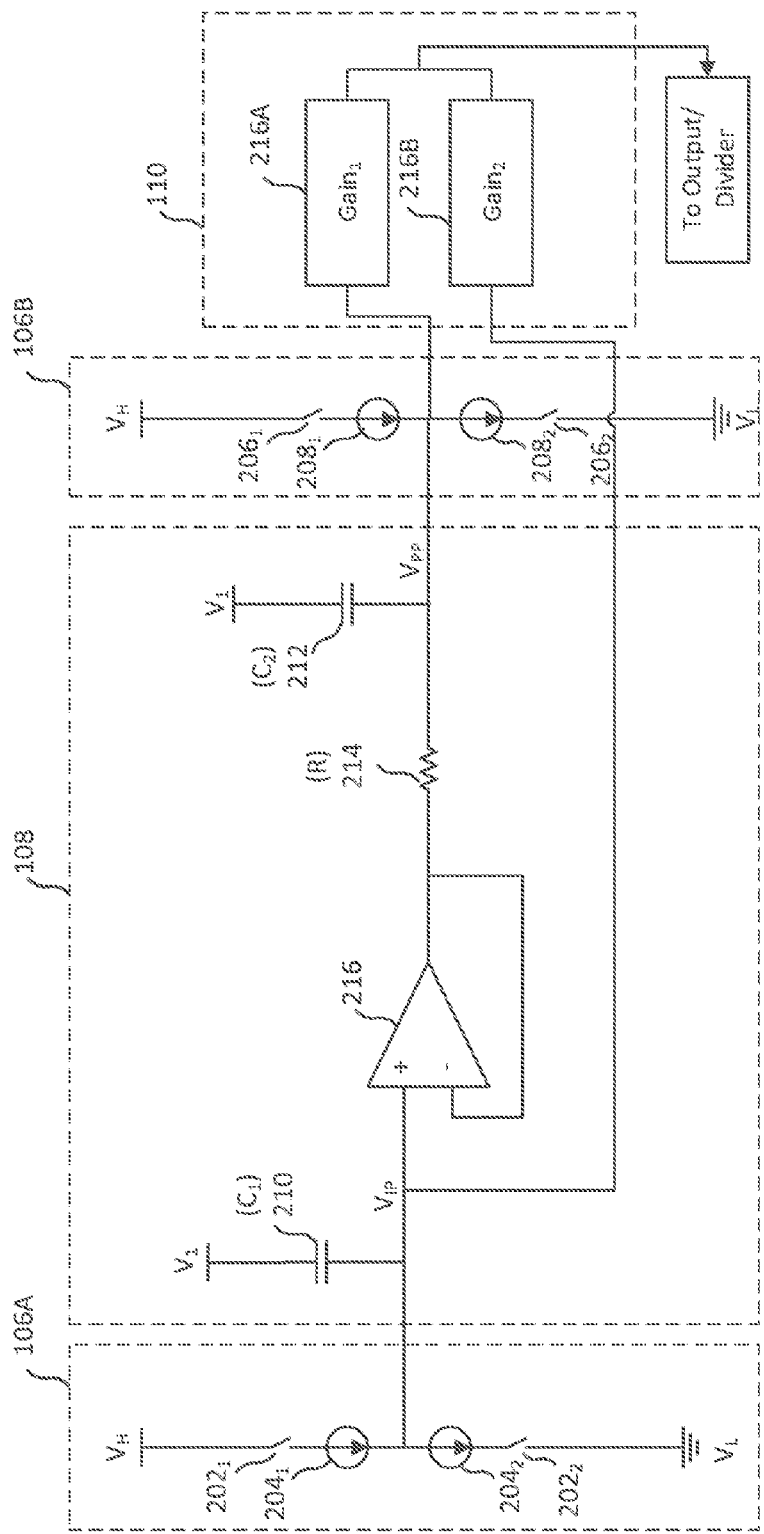
FIG. 2 is a schematic diagram of portions of charge pumps, a loop filter, and a voltage-controlled oscillator in accordance with an embodiment.

FIG. 2 is a schematic diagram of portions of the charge pumps 106A and 106B, the loop filter 108, and the VCO 110 in accordance with an embodiment. Each of the charge pumps 106A and 106B include a high-side leg coupled to high voltage node $V_H$ and a low-side leg coupled to a low voltage node $V_L$. The high voltage node may be a power supply voltage $V_{DD}$ and the low voltage node may be a low reference voltage, such as ground. The high-side legs include current sources $204_1$ and $208_1$, which are connected in series with electronic switches $202_1$ and $206_1$, respectively. Likewise, the low-side legs include current sources $204_2$ and $208_2$, which are connected in series with electronic switches $202_2$ and $206_2$, respectively. The electronic switches are controlled by the phase-indicator up signal and the phase-indicator down signal, respectively. The high-side leg and the low-side leg of the respective charge pumps 106A and 106B are connected to each other, and define output nodes $V_{IP}$ (Voltage of the Integral Path) and $V_{PP}$ (Voltage of the Proportional Path) of the charge pumps 106A and 106B, respectively. The output nodes $V_{IP}$ and $V_{PP}$ of the charge pumps 106A and 106B supply current signals to the filter paths of the loop filter 108.

In operation, when the phase-indicator up signal and the phase-indicator down signal of the charge pump 106A are configured such that the electronic switch $202_1$ of the high-side leg is closed while the electronic switch $202_2$ of the low-side leg is open, the charge pump 106A sources the current from the current source $204_1$ to the node $V_{IP}$. Conversely, when the phase-indicator up signal and the phase-indicator down signal of the charge pump 106A are configured such that the electronic switch $202_1$ of the high-side leg is open while the electronic switch $202_2$ of the low-side leg is closed, the charge pump 106A sinks the current from the current source $204_2$ from the node $V_{IP}$. Hence, the current source $204_1$ injects a positive current proportional to the phase difference of the input signal 102 and the feedback signal 114 into the node $V_{IP}$, and the current source $204_2$ injects a negative current (i.e. draws a current) proportional to the phase difference of the input signal 102 and the feedback signal 114 from the node $V_{IP}$.

Likewise, in operation, when the phase-indicator up signal and the phase-indicator down signal of the charge pump 106B are configured such that the electronic switch $206_1$ of the high-side leg is closed while the electronic switch $206_2$ of the low-side leg is open, the charge pump 106B sources the current from the current source $208_1$ to the node $V_{PP}$. Conversely, when the phase-indicator up signal and the phase-indicator down signal of the charge pump 106B are configured such that the electronic switch $206_1$ of the high-side leg is open while the electronic switch $206_2$ of the low-side leg is closed, the charge pump 106B sinks the current from the current source $208_2$ from the node $V_{PP}$. Hence, the current source $208_1$ injects a positive current proportional to the phase difference of the input signal 102 and the feedback signal 114 into the node $V_{PP}$, and the current source $208_2$ injects a negative current (i.e. draws a current) proportional to the phase difference of the input signal 102 and the feedback signal 114 from the node $V_{PP}$.

The loop filter 108 includes a first filter path and a second filter path with the first filter path coupled to the node $V_{IP}$ and the second filter path coupled to the node $V_{PP}$. The first and second filter paths are separated by an isolation buffer 216. In the illustrated embodiment, the isolation buffer 216 is implemented as an operational amplifier (op-amp) configured as a unity gain buffer with the node $V_{IP}$ coupled to the non-inverting input of the op-amp 216 and the output of the op-amp 216 fed back to the inverting input of the op-amp 216. In some embodiments, the op-amp 216 is a single-stage op-amp and is biased with a current of about 50 µA. In other embodiments, the isolation buffer 216 may be a cascade of two or more source followers/emitter follower circuits, or any other suitable isolation circuit.

The first filter path includes a capacitor 210 ($C_1$) coupled between the node $V_{IP}$ and a reference node $V_1$. The reference node $V_1$ may be referred to as the common node (supply or ground or some other common voltage, for example) of the loop filter 108 and/or the VCO 110. The first filter path is sometimes referred to as an integral path as the capacitor 210 integrates the current from the charge pump 106A to provide an average frequency to the VCO 110. The first filter path is output to the gain stage 216B of the VCO 110.

The second filter path includes a capacitor 212 ($C_2$) coupled between the node $V_{PP}$ and the reference node $V_1$ and a resistor 214 (R) coupled between the output of the op-amp 216 and the node $V_{PP}$. The second filter path is sometimes referred to as a proportional path as the resistor 214 provides instantaneous phase correction without affecting the average frequency. The second filter path is output to the gain stage 216A of the VCO 110. In some embodiments, the gain stages 216A and 216B of the VCO 110 apply different gain factors to their respective input signals from the loop filter 108.

The sizes of the capacitors 210 and 212 are important as they affect the stability of the PLL 100. Because the PLL 100 is a high-order negative feedback system, it requires a zero value using a non-zero valued resistor to provide a suitable phase margin to maintain the stability of the PLL. The zero value is determined by the loop filter 108, and typically the zero value is a fraction of the loop bandwidth of the PLL. Hence, such a small zero value requires a large capacitance value for the capacitor 210. For example, in a specific embodiment, the capacitor 210 has a value of about 210 pF, the capacitor 212 has a value of about 8.5 pF, the resistor 214 has a value of about 4000 Ohms, and the current value of the current sources 204 and 208 are about 25 µA. Therefore, the capacitor 210 would require a large amount of area and would greatly affect the overall area of the PLL 100.

In some embodiments, the capacitors 210 and 212 are implemented using metal-oxide-semiconductor field-effect transistors (MOSFETs). MOSFET capacitors have higher capacitance density than metal capacitors, and thus, using MOSFET capacitors can further reduce the overall area of the PLL 100.

The VCO 110 includes two gain stages 216A and 216B as represented conceptually in FIG. 2. Each of gain stages 216A and 216B is coupled to a separate filter path of the loop filter 108 such that the first and second filter paths of the loop filter 108 can have different gain factors applied to them. The gain stages 216A and 216B of the VCO 110 may be implemented, for example, using MOSFETs, bipolar transistors, voltage-controlled capacitors (varactors), the like, or any other suitable components for implementing gain stages. The outputs of the gain stages 216A and 216B, preferably in current, may be summed together by a summing bus (not shown) and may then be sent to a current-controlled oscillator (CCO) (not shown) before being output to the output signal 116 and the frequency divider 112. The VCO 110 may be a voltage controlled low noise oscillator including resonators, a voltage-controlled ring oscillator, or any other suitable voltage-controlled oscillator.

Thermal noise from the op-amp 216 and the resistor 214 may cause increased jitter and other stability issues in the PLL 100. Jitter is the undesired deviation from true periodicity of an assumed periodic signal in electronics and telecommunications, often in relation to a reference clock source. Jitter may be observed in characteristics such as the frequency of successive pulses, the signal amplitude, or phase of periodic signals. Jitter is a significant, and usually undesired, factor in the design of almost all PLL circuits.

Jitter may be caused by electromagnetic interference (EMI) and crosstalk with carriers of other signals in addition to thermal noise. Thermal noise is present in all active and passive elements. The signal at the node $V_{PP}$ has thermal noise components due to the op-amp 216 and the resistor 214 in the loop filter 108. This thermal noise along with the voltage signal at node $V_{PP}$ gets amplified by the VCO 110, (e.g., by a gain (K)). One may approximate the contribution of thermal noise as: $V_n^2=4kT(R+Req)$, where k is the Boltzmann Constant (1.38e−23 J/K), T is Absolute temperature in Kelvin, R is the value of the resistor 214, and Req is the equivalent resistance value for the op-amp 216. Thus, Applying the gain stage of the VCO 110 with a gain of K, for example, the noise is multiplied by K resulting in noise equal to $4kT(R+Req)*K^2$.

Figure 3:
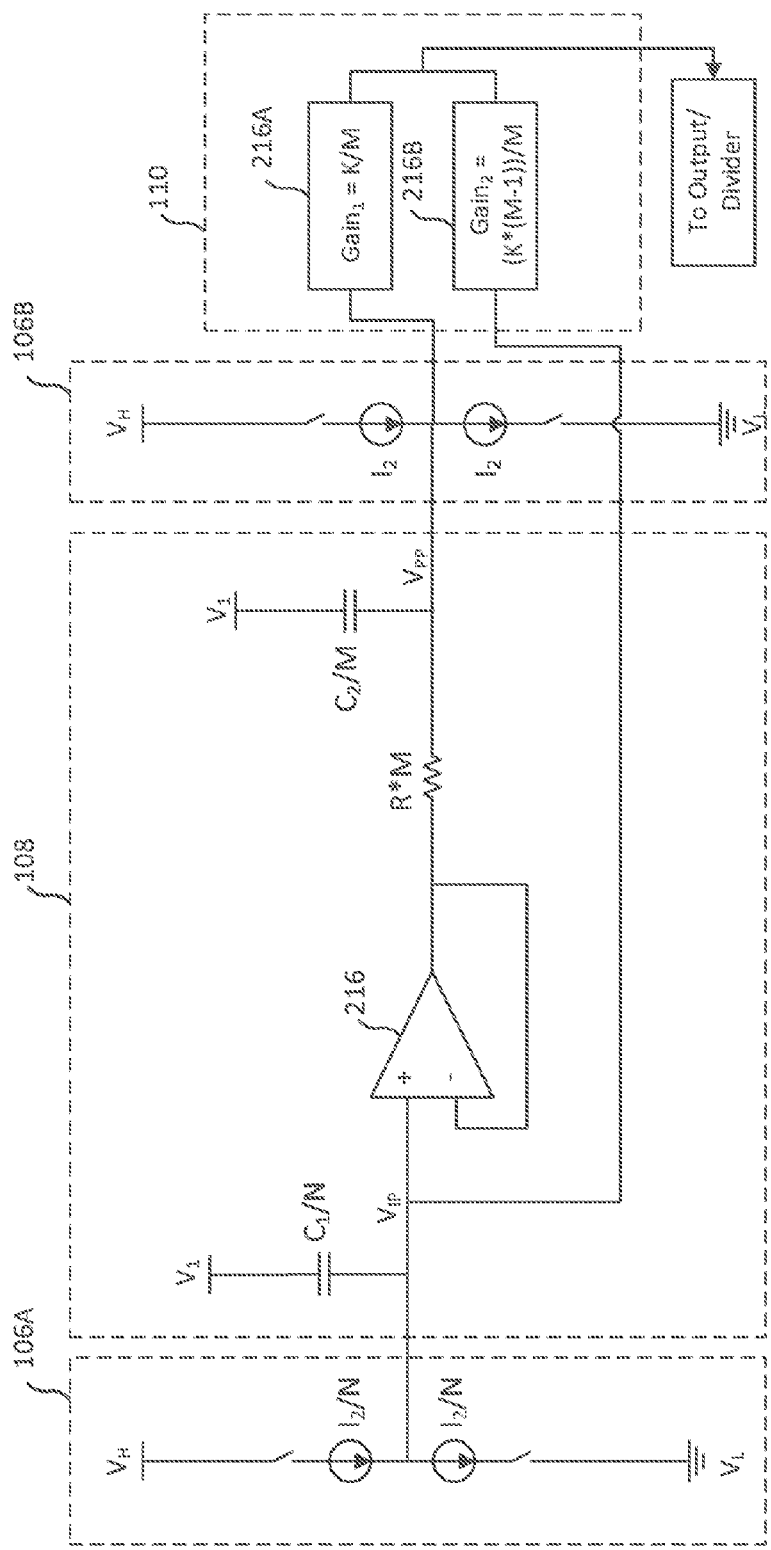
FIG. 3 is a schematic diagram of portions of charge pumps, a loop filter, and a voltage-controlled oscillator in accordance with another embodiment.

FIG. 3 is a schematic diagram of a specific embodiment of the charge pumps 106A and 106B, the loop filter 108, and the VCO 110 of FIG. 2 in accordance with an embodiment. In this embodiment, the current sources for the charge pump 106B have current values of $I_2$ and the current sources for the charge pump 106A have current values of $I_2/N$. Hence, the current of the charge pump 106A is less than the current of the charge pump 106B and they are related by a current ratio of N, with N being greater than 1.

In some embodiments, N is used as a scaling factor applied to the capacitor $C_1$ in the first filter path (integral path), such that the value of the capacitor $C_1$ may be scaled down by a factor of N. This may be accomplished because the current value ($I_2/N$) of the first filter path (integral path) is N times smaller than the current value ($I_2$) of the second filter path (proportional path), and thus, the capacitance of the capacitor $C_1$ is magnified N times equivalently. Hence, the size necessary for the capacitor is greatly reduced (by a factor of N). Using the example above wherein the capacitor 210 ($C_1$) had a value of 250 pF, by setting the scaling factor N equal to 10 (i.e. reducing the current value of the charge pump 106A to be about 10 times less than the current value of the charge pump 106B), the value of the capacitor $C_1$ may be reduced by N=10 times to be about 25 pF. This change would save 225 pF of area for the PLL 100.

In addition, the gains of the two gain stages 216A and 216B may be adjusted by a scaling factor M (wherein M is greater than 1) with the values of the resistor 214 (R) and the capacitor 212 ($C_2$) of the second filter path also being scaled accordingly. As illustrated, the gain stage 216A has a gain equal to K/M and the second gain stage 216B has a gain equal to (K*(M−1))/M. In order to maintain loop stability and filtering with the introduction of the different gain stages 216A and 216B, the values of the components in the second filter path are also adjusted. Hence, the resistor 214 may be multiplied by the scaling factor M and the first capacitor 212 may be divided by the scaling factor M. With the scaling factor M and the two gain stages, the thermal noise from the op-amp 216 and the resistor 214 is reduced by a factor of M as the gain of the gain stage 216A is divided by a factor of M.

The scaling of the second filter path components by the factor M and the scaling of two gain stages of the VCO 110 are described in further detail including further applicable embodiments in U.S. patent application Ser. No. 13/547,742 filed on Jul. 12, 2012 and entitled "Phase Locked Loop Circuit with Reduced Jitter," which application is incorporated herein by reference.

By having the isolation buffer 216, which effectively decouples the paths of the PLL 100, the design of the PLL 100 can accomplish the capacitance multiplication in the integral path by reducing the current for one charge pump, and thus, saving the large area typically required for the zero-capacitance capacitor. In addition, the thermal noise from the resistor 214 and isolation buffer 216 in the proportional path can be reduced by having the majority of the gain of the VCO 110 in the integral path and reducing the gain in the proportional path.

Figure 4:
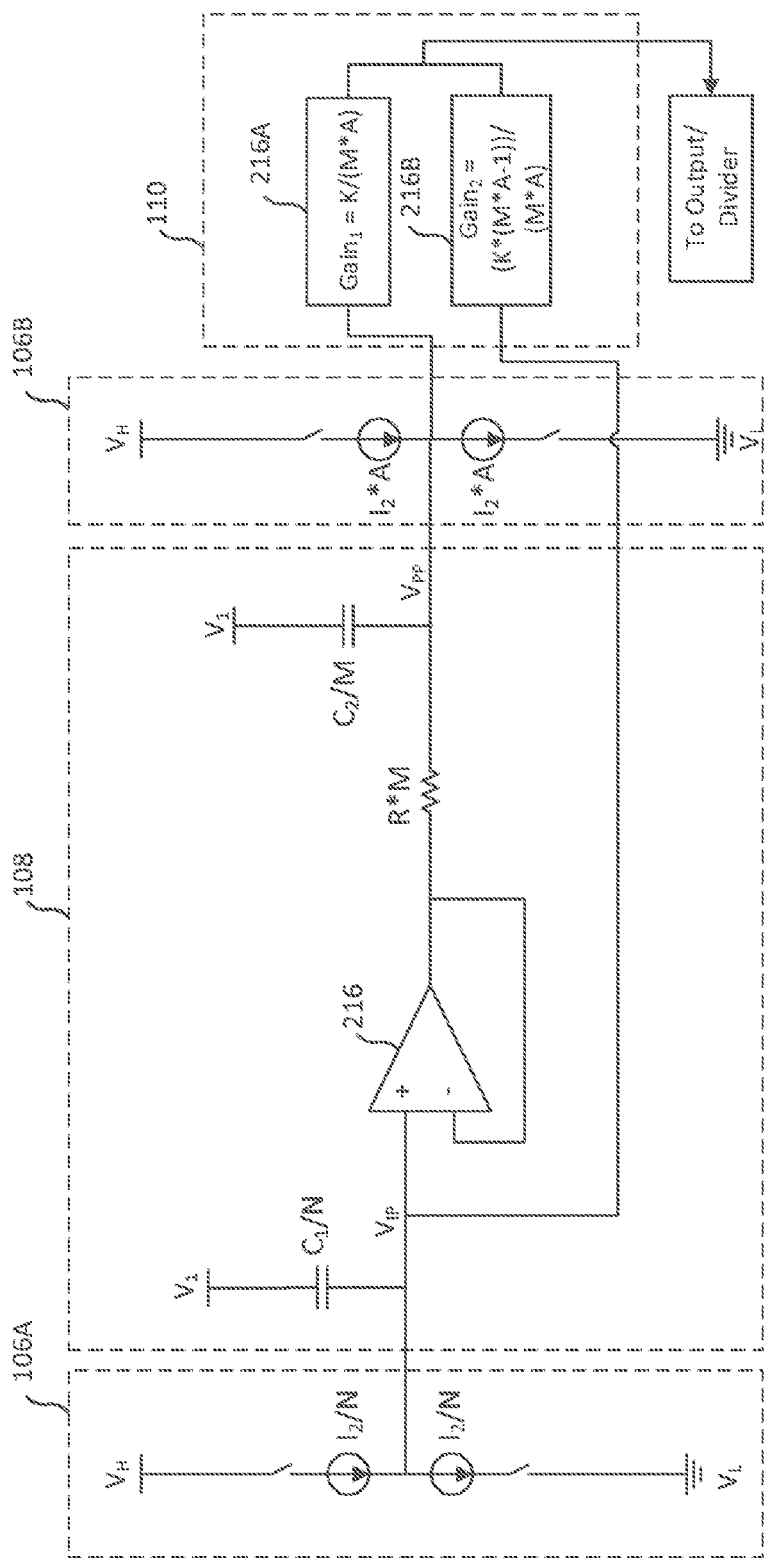
FIG. 4 is a schematic diagram of portions of charge pumps, a loop filter, and a voltage-controlled oscillator in accordance with another embodiment.

FIG. 4 is a schematic diagram of a specific embodiment of the charge pumps 106A and 106B, the loop filter 108, and the VCO 110 of FIG. 2 in accordance with another embodiment. This embodiment is similar to the embodiment in FIG. 3 except that this embodiment further includes a scaling factor A applied to the current sources of the charge pump 106B. In this embodiment, the N and M scaling factors are applied in a similar manner as discussed above in the previous embodiment and the descriptions are not repeated herein. This embodiment further reduces the thermal noise of the resistor 214 and the op-amp 216, and the charge pump noise as explained below.

This embodiment includes a scaling factor A applied to the current sources of the charge pump 106B and the gain stages 216A and 216B. In this embodiment, the gains of the two gain stages 216A and 216B may be adjusted by the scaling factor A (wherein A is greater than 1) such that the gain stage 216A has a gain equal to $K/(M*A)$ and the second gain stage 216B has a gain equal to $(K*(M*A-1))/(M*A)$. Given these changes, the thermal noise contributed by the resistor 214 is reduced further by a factor of $A^2$. In addition, in this embodiment, when the op-amp 216 is a single-stage op-amp and is biased with a current of 50 µA, the thermal noise contributed by the op-amp drops below the noise level of the resistor 214. In this embodiment, the charge pump noise from the proportional path is reduced by a factor of A, which counters the increased charge pump noise (by a factor of N) from the integral path, leading to an overall jitter improvement in the PLL.

Figure 5:
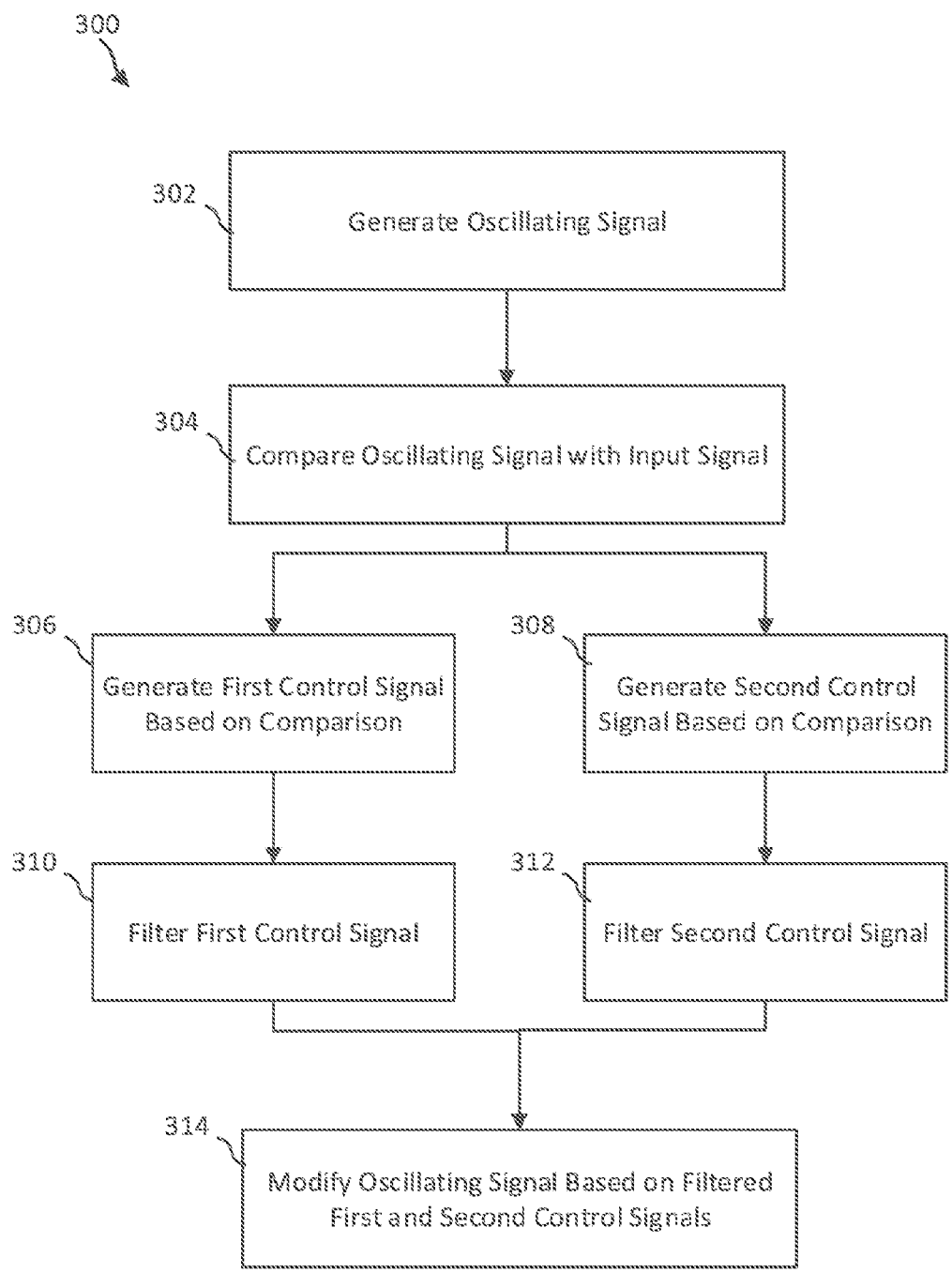
FIG. 5 illustrates a block diagram of a method of operation in accordance with an embodiment.

FIG. 5 illustrates a block diagram of a method of operation 300 for operating a PLL including steps 302-314. According to various embodiments, step 302 includes generating an oscillating signal. In some embodiments, the oscillating signal may be generated in a voltage-controlled oscillator.

Step 304 includes comparing the oscillating signal with an input signal. In some embodiments, the phases of the oscillating signal and the input signal are compared in a phase detector. The oscillating signal may be divided by a frequency divider before being compared with the input signal.

Step 306 includes generating a first control signal having a first current at a first node based on the comparison of the oscillating signal with the input signal. The first control signal may be generated by a first charge pump based on the output of a phase detector. Step 308 includes generating a second control signal having a second current at a second node based on the comparison of the oscillating signal with the input signal. The second control signal may be generated by a second charge pump based on the output of a phase detector. In some embodiments, the first current and the second current may have different current values. In an embodiment, the second current is larger than the first current.

Step 310 includes filtering the first control signal using a first filter path. In some embodiments, the first filter path may include a capacitor. The first filter path may be referred to as the integral path. Step 312 includes filtering the second control signal using a second filter path. In some embodiments, the second filter path includes a resistor and a capacitor. The second filter path may be referred to as the proportional path. In some embodiments, the second filter path is substantially isolated from the first filter path. The first and second filter paths may be substantially isolated from each other by an operational amplifier configured as a unity gain buffer. The filtering of the first and second control signals may be performed in a loop filter.

Step 314 includes modifying the oscillating signal based on the filtered first control signal and the filtered second control signal. This step may include applying a first gain factor to the filtered first control signal, and applying a second gain factor to the filtered second control signal. In some embodiments, the second gain factor is different than the first gain factor. In an embodiment, the first gain factor is larger than the second gain factor. The modifying step may further include summing the filter control signals together after they have had their respective gain factors applied to them. This modifying step may be performed in the voltage-controlled oscillator.

According to various embodiments described herein, advantages include having an isolation buffer that effectively decouples the paths of the PLL. By decoupling the paths of the PLL, the design of the PLL can accomplish the capacitance multiplication in the integral path by reducing the current for one charge pump, and thus, saving the large area typically required for the zero-capacitance capacitor. In addition, the thermal noise from the resistor and isolation buffer in the proportional path can be reduced by having the majority of the gain of the VCO in the integral path and reducing the gain in the proportional path.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A circuit comprising:
    a first charge pump configured to generate a first current at a first node;
    a second charge pump configured to generate a second current at a second node, the second current being different than the first current;
    a loop filter coupled between the first and second nodes, the loop filter comprising:
        a first filter path comprising a first capacitor coupled between the first node and a reference voltage node;
        a second filter path comprising a second capacitor and a resistor, the second capacitor being coupled between the second node and the reference voltage node, the resistor being coupled to the second node; and
        an isolation buffer comprising an operational amplifier interposed between the first and second filter paths, the first node being coupled to a first input of the operational amplifier, the resistor of the second filter path being coupled between an output of the operational amplifier and the second node, the resistor being directly connected to the output of the operational amplifier; and
    an oscillator having a first input and a second input, the first input coupled to the first node, the second input coupled to the second node, the second node being between the output of the operational amplifier and the second input of the oscillator.

2. The circuit of claim 1, wherein the oscillator is configured to apply a first gain to the first input and a second gain to the second input, the first gain being larger than the second gain.

3. The circuit of claim 1, wherein the operational amplifier is configured as a unity gain buffer.

4. The circuit of claim 1, wherein the oscillator comprises a voltage-controlled low noise oscillator, a voltage-controlled ring oscillator, or a combination thereof.

5. The circuit of claim 1, wherein the first charge pump comprises a first pair of switches on opposite sides of the first node, the first charge pump being configured to source the first current to the first node or sink the first current from the first node by operation of the first pair of switches, and wherein the second charge pump comprises a second pair of switches on opposite sides of the second node, the second charge pump being configured to source the second current to the second node or sink the second current from the second node by operation of the second pair of switches.

6. The circuit of claim 1, wherein the first current is less than the second current by a ratio of N.

7. The circuit of claim 1, wherein the first capacitor is larger than the second capacitor.

8. The circuit of claim 1, wherein the first current is less than the second current by a ratio of N, a capacitance value of the first capacitor being scaled down by N.

9. The circuit of claim 2, wherein capacitance values of the second capacitor and the resistor are scaled by a scaling factor M, the second capacitor being reduced by the scaling factor M and the resistor being increased by the scaling factor M.

10. The circuit of claim 9, wherein the second gain of the oscillator is reduced by the scaling factor M.

11. The circuit of claim 9, wherein the second current is increased by a scaling factor A, and wherein the second gain of the oscillator is reduced by the product of the scaling factors M and A.

12. The circuit of claim 2, wherein the isolation buffer comprises an operational amplifier configured as a unity gain buffer, and wherein the second gain of the oscillator is configured to reduce thermal noise from the operational amplifier and the resistor.

13. The circuit of claim 2, wherein the isolation buffer comprises an operational amplifier configured as a unity gain buffer, and wherein the second gain of the oscillator and the second current are configured to reduce thermal noise from the operational amplifier, the resistor, and the second charge pump.

14. The circuit of claim 1, wherein the first capacitor and the second capacitor each comprises metal-oxide-semiconductor field-effect transistors (MOSFETs).

15. The circuit of claim 2, wherein the oscillator further comprises a first gain stage configured to apply the first gain and a second gain stage configured to apply the second gain, the first and second gain stages each comprising MOSFETs, bipolar transistors, voltage-controlled capacitors, or a combination thereof.

16. A phase-locked loop (PLL) comprising:
a phase detector;
a first charge pump and a second charge pump coupled to the phase detector, the first charge pump configured to generate a first current and the second charge pump configured to generate a second current, the second current being larger than the first current;
a loop filter coupled to the first charge pump and the second charge pump, a first filter path coupled to the first charge pump and a second filter path coupled to the second charge pump, the first and second filter paths being separated by an isolation buffer, the isolation buffer comprising an operational amplifier, an output of the operational amplifier being directly connected to an inverting input of the operational amplifier; and
an oscillator coupled to outputs of the first and second filter paths, the oscillator configured to reduce the thermal noise of the second filter path and the isolation buffer.

17. The PLL of claim 16, wherein the oscillator comprises a voltage controlled oscillator.

18. The PLL of claim 16, wherein the oscillator is further configured to apply a first gain to an output of the first filter path and a second gain to an output of the second filter path, the second gain being different than the first gain.

19. The PLL of claim 18, wherein the first gain is larger than the second gain.

20. The PLL of claim 16, wherein the first filter path comprises a first capacitor, and wherein the second filter path comprises a second capacitor and a resistor, the resistor coupled between the isolation buffer and the oscillator.

21. The PLL of claim 20, wherein the first capacitor is larger than the second capacitor.

22. The PLL of claim 20, wherein the first current is less than the second current by a ratio of N, a capacitance value of the first capacitor being scaled down by N.

23. The PLL of claim 20, wherein capacitance values of the second capacitor and the resistor are scaled by a scaling factor M, the second capacitor being reduced by the scaling factor M and the resistor being increased by the scaling factor M.

24. The PLL of claim 23, wherein the oscillator is further configured to apply a first gain to an output of the first filter path and a second gain to an output of the second filter path, wherein the second gain of the oscillator is reduced by the scaling factor M.

25. A method of operating a phase locked loop comprising:
generating an oscillating signal;
comparing the oscillating signal with an input signal;
generating a first control signal having a first current at a first node based on the comparison of the oscillating signal with the input signal;
generating a second control signal having a second current at a second node based on the comparison of the oscillating signal with the input signal, the second current being different than the first current;
filtering the first control signal using a first filter path;
filtering the second control signal using a second filter path, the second filter path being substantially isolated from the first filter path by an operational amplifier, the first filter path being coupled to a first input of the operational amplifier, the second filter path being coupled to an output of the operational amplifier, the first input of the operational amplifier being a non-inverting input of the operational amplifier, the output of the operational amplifier being directly connected to an inverting input of the operational amplifier; and
modifying the oscillating signal based on the filtered first control signal and the filtered second control signal.

26. The method of claim 25, wherein the modifying the oscillating signal further comprises:
applying a first gain factor to the filtered first control signal; and
applying a second gain factor to the filtered second control signal, the second gain factor being different than the first gain factor.

27. The method of claim 26, wherein the first gain factor is larger than the second gain factor.

28. The method of claim 25, wherein the second current is larger than the first current.

29. The method of claim 25, wherein the generating the first control signal further comprises switching a pair of electronic switches of a first charge pump, and wherein the generating the second control signal further comprises switching a pair of electronic switches of a second charge pump.

30. The circuit of claim 1, wherein the first input of the operational amplifier is a non-inverting input of the operational amplifier, the output of the operational amplifier being directly connected to an inverting input of the operational amplifier.

* * * * *